United States Patent [19]

Nagesh et al.

[11] Patent Number: 5,155,661
[45] Date of Patent: Oct. 13, 1992

[54] ALUMINUM NITRIDE MULTI-CHIP MODULE

[75] Inventors: Voddarahalli K. Nagesh, Cupertino; Kim H. Chen, Fremont, both of Calif.

[73] Assignee: Hewlett-Packard Company, Palo Alto, Calif.

[21] Appl. No.: 700,784

[22] Filed: May 15, 1991

[51] Int. Cl.$^5$ ............................................... H05K 7/20
[52] U.S. Cl. .................................. 361/386; 165/80.3; 174/252; 357/81; 361/413
[58] Field of Search ................. 357/81; 174/16.3, 252, 174/255, 256, 260; 165/80.3, 185; 361/383, 386–389, 400, 403, 412, 413, 414; 439/66–69, 74, 77, 485

[56] References Cited

U.S. PATENT DOCUMENTS

| | | | |
|---|---|---|---|
| 4,509,099 | 4/1985 | Takamatsu | 361/413 |
| 4,533,976 | 8/1985 | Suwa | 361/395 |
| 4,961,987 | 10/1990 | Okuno | 428/209 |
| 5,027,191 | 6/1991 | Bourdelaise | 357/74 |
| 5,041,700 | 8/1991 | Iyosi | 174/255 |
| 5,055,914 | 10/1991 | Shimizu | 357/81 |

Primary Examiner—Gerald P. Tolin

[57] ABSTRACT

A multi-chip module is configured using an aluminum nitride, or AlN, multi-chip substrate, sandwiched chip side down under an extruded aluminum convection cooled heat sink. An alignment ring includes grooves for control of z-axis elastomeric conductors slightly compressed between the chip connection surface of the substrate and the top surface of a PCB to provide the interconnections therebetween. The alignment ring includes a stopper portion which controls the height of the heat sink above the PCB as well as a smaller rail portion which controls the height of the substrate above the PCB. The good thermal conductivity, ruggedness and relatively good TCE match of the AlN substrate to the silicon chips permits a convenient, dense and thermally rugged MCM.

5 Claims, 2 Drawing Sheets

ALUMINUM NITRIDE MULTI-CHIP MODULE

BACKGROUND OF THE INVENTION

1. Field of the Invention

This invention relates to the manufacturing and assembly of large, dense multi-chip electronic packages including large scale integrated circuits, or IC's, and other multi-chip modules, or MCMs, including those used for large microprocessors and other system level, application specific integrated circuits, or ASICs.

2. Description of the Prior Art

The Conventional approach to the fabrication of such large, dense multi-chip electronic packages has been the large or very large scale integrated circuit in which a single large monolithic silicon chip is used as a substrate on which all required circuits are integrated. The chip is then packaged in one of several multi-lead electronic packages.

The complexity of such chips has resulted in relatively costly design cycles and low manufacturing yields. The increasing integration demanded by circuit complexity and high on-chip clock speeds has resulted in the search for alternate packaging approaches.

A substantial improvement for some of the limitations surrounding large scale monolithic IC designs has resulted from the development of multi-chip modules, or MCMs. In a typical MCM, a complex circuit is distributed among two or more separate chips, or sub-chips. Each such sub-chip contains only a portion of the overall circuitry of the MCM and is, therefore, substantially less complex and expensive to design, prototype, build and test than the equivalent monolithic chip.

The challenge for MCMs has been the development of a serviceable multi-chip substrate packaging strategy. There are several attractive high density techniques available for the interface between the multi-chip substrate and the individual sub-chips, including TAB bonding, flip-chips and wire bonding. The effective use of such techniques has been limited by the difficulties and expenses associated with the substrate packaging interface, particularly those resulting from the high thermal management problems caused by the relatively high chip densities achievable with the chip to substrate techniques described above.

What is needed, therefore, is a convenient and economical MCM substrate packaging technique capable of handling sufficient heat dissipation levels, achieving desired higher performance levels and permiting exploitation of the emerging chip to substrate interconnection techniques. Several approaches have been developed which are not completely satisfactory.

One such approach uses silicon wafer substrates in order to achieve an optimum heat transfer between the silicon chips and the substrate. This approach is severely limited by the relative fragility of silicon material as a substrate. This approach requires a high degree of flatness between the non-chip side of the substrate, and the heat sink apparatus used to dissipate the enormous heat generated by the dense chip arrays, in order to avoid breakage of the expensive substrate. This approach does not provide convenient interconnect structures within the silicon and therefore requires sequentially processed thin film structures. This approach does not provide convenient techniques for providing leads or pins for connection out of the silicon substrate.

Aluminum oxide has also been used as an MCM substrate, but it has severe limitations. Aluminum oxide is not closely thermally matched to the silicon chips to be mounted on it and does not have good thermal conductivity. The packaging assemblies using aluminum oxide substrates are also therefore cumbersome, costly and/or ineffective.

SUMMARY OF THE INVENTION

The preceding and other shortcomings of the prior art are addressed and overcome by the present invention that provides in a first aspect, an integrated circuit multi-chip module utilizing a multilayer, sintered aluminum nitride fired ceramic substrate compressed chip side down between an extended aluminum heat sink and a printed circuit board. An alignment ring including slightly compressed elastomeric connectors is used to position the substrate and heat sink and interconnect the substrate to the PCB. The good thermal conductivity, ruggedness and silicon TCE match of the AlN substrate permits a simple and economical, but thermally and mechanically rugged, high density substrate package compatible with current chip to substrate interconnection approaches such as TAB, flip chip and wire bonding techniques.

In a further aspect, the present invention provides a multi-chip module including a heat sink, an aluminum nitride substrate thermally connected on a first surface to the heat sink, a plurality of silicon chips mounted on a second surface of the substrate, alignment ring means having a first portion for supporting the heat sink above a printed circuit board and a second section supporting the substrate above the circuit board, and elastomeric connector means associated with the alignment ring means for providing electrical connection between the substrate and the printed circuit board.

These and other features and advantages of this invention will become further apparent from the detailed description that follows which is accompanied by one or more drawing figures. In the figures and description, numerals indicate the various features of the invention, like numerals referring to like features throughout both the drawings and the description.

DETAILED DESCRIPTION OF THE PREFERRED EMBODIMENT(S)

Figure 1:
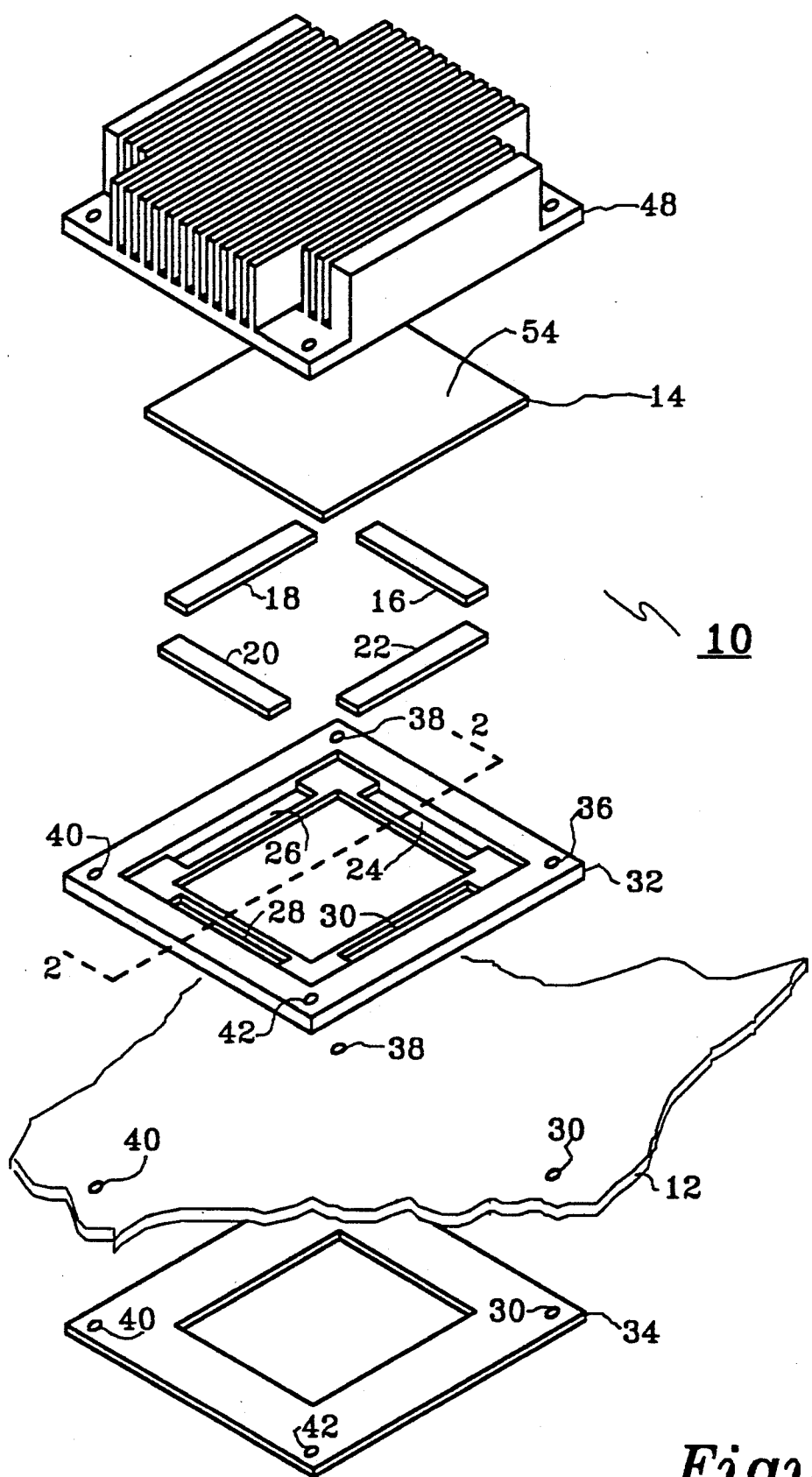
FIG. 1 is an exploded isometric view of an MCM according to the present invention.
Figure 2:
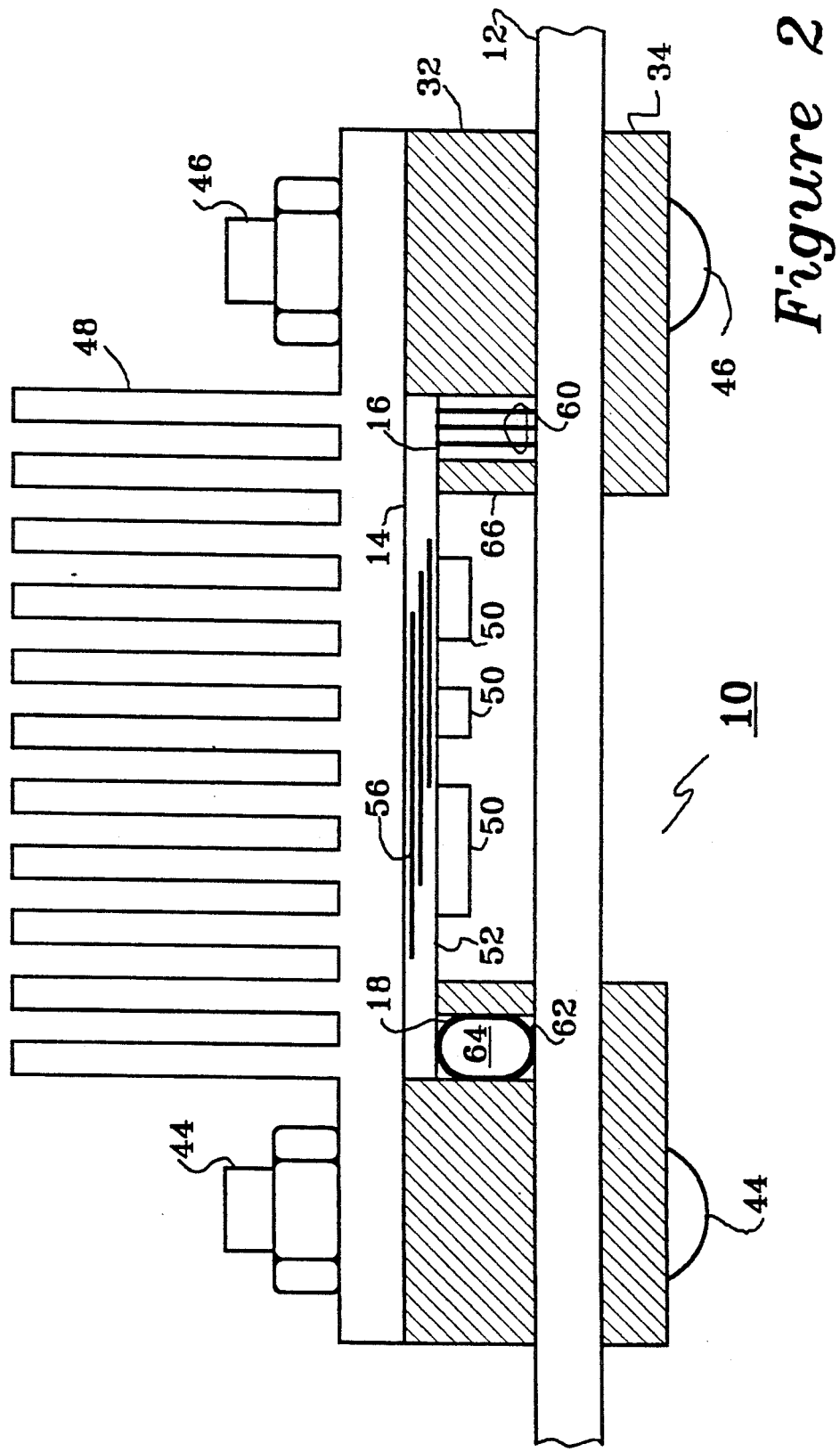
FIG. 2 is cross sectional view of MCM 10, taken along line 22 in FIG. 1, with MCM 10 mounted on PCB 12 and with some dimensions exaggerated for clarity of disclosure.

FIG. 1 is an exploded isometric view of MCM 10, including a partial cutaway portion of multilayer printed circuit board, or PCB, 12 on which MCM 10 is intended to be mounted. FIG. 2 is a cross sectional view of MCM 10, taken along line AA in FIG. 1 with MCM 10 mounted on PCB 12 and with some dimensions exaggerated for clarity of disclosure. The following discussion references both figures.

MCM 10 includes substrate 14 supported On z-axis elastomeric connectors 16, 18, 20, and 22 which fit into grooves 24, 26, 28, and 30 of alignment ring 32. Support ring 34 is mounted on one side of PCB 12 by four fasteners, two of which are shown as screw and nut pairs 42 and 46 in FIG. 2. The fasteners are positioned through the appropriate mounting holes, such as holes 36, 38, 40, and 42, to fasten heat sink 48 against the other side of PCB 12. This assembly serves to maintain close contact between heat sink 48 and heat sink surface 54 of substrate 14 compressing connectors 16, 18, 20, and 22 in grooves 24, 26, 28, and 30, thereby providing multiple electrical conduction paths between substrate 14 and PCB 12. A thin layer of thermal grease may be applied between heat sink 48 and heat sink surface 54 of substrate 14 before assembly to assure a good thermal connection therebetween.

Z-axis elastomeric connectors 16, 18, 20, and 22 may be configured from any one of several commercially available elastomeric connector materials.

One convenient product uses electrical conductors embedded as a matrix in a bar of elastomer, such as the GD type interconnector available from Shin-Etsu America of Union City, Calif. An example of this type of connector is shown in FIG. 2 as z-axis elastomeric connector 16. The cross section of elastomeric connector 16 in the figure exposes three fine conductors, shown as embedded conductors 60, which may conveniently be spaced on the order of 1.0 mm apart. A matrix of such wires is embedded in connector 16 so that another cross section, parallel to the one in the figure and spaced about 1.0 mm on either side, would expose an additional set of three embedded conductors 60.

Another style of elastomeric conductor is illustrated as z-axis elastomeric connector 18 in FIG. 2. In this approach, a series of parallel conducting paths are formed on a flexible material, shown as flex conductor 62, which is then wrapped fully or partially around a nonconducting elastomeric core, such as core 64.

In operation, z-axis elastomeric connector 16 provides a direct connection between any pair of opposing conductor pads on substrate 14 and PCB 12, via embedded conductors 60 and or flex conductor 62. Before assembly of MCM 10, it may be convenient for connectors 16, 18, 20, and 22 to fit within grooves 24, 26, 28, and 30 and extend above rail portion 66 of alignment ring 32 on the order of about 1.0 mm. Final assembly of MCM 10, as shown in FIG. 2, permits substrate 14 to be pressed against rail portion 66 partially squashing connectors 16, 18, 20, and 22 to assure a good electrical connection.

A series of silicon chips 50 are mounted and interconnected by conventional techniques, including TAB, flip chip and wire bonds, on connection surface 52 of substrate 14 to form the electronic circuit packaged within MCM 10. Substrate 14 may conveniently be a multilayer substrate including a series of internal and/or surface conducting paths 56 for interconnecting silicon chips 50 with each other and with similar surface and/or conducting paths in substrate 14.

The material from which substrate 14 is fabricated is of critical importance to the present invention. In the preferred embodiment, substrate 14 is a multilayer substrate configured from a sintered aluminum nitride, or AlN, fired ceramic material, available for example from the Corning Glass Company or Ibiden USA Corporation of Sunnyvale, Calif. AlN has superior thermo-physical properties that prove very useful for minimizing thermal stresses in MCM 10. Commercially available AlN may have thermal conductivity at 170 watts/cm while higher thermal conductivities, in the range of about 220 watts/cm, should be available on special order.

The high thermal conductivity of AlN substrate 14 obviates the need for a heat spreader in the thermal design of MCM 10. As shown in the figures, heat sink 48 may be bonded directly or with thermal grease to heat sink surface 54 of substrate 14.

Further, the thermal coefficient of expansion, or TCE, of AlN substrate 14 is 4.2 ppm which is very close to the 3.5 ppm TCE of silicon chips 50, alleviating the die cracking, or fatigue failure of solder joints in the case of flip-chips, that has occurred with previous approaches to MCM packaging as a result of the significant thermal stresses from differential thermal expansion between conventional substrates and the silicon chips bonded thereto, such as silicon chips 50, especially for large silicon chips on the order of 1 cm. per side or larger.

The good thermal match between AlN substrate 14 and silicon chips 50 permits the use of highly thermally conductive metal die attachment techniques, such as the use of amalgam between each silicon chip 50 and substrate 14. As a consequence, heat sink 48 may conveniently be a simple extruded aluminum heat sink and used with conventional air cooling designs to handle power dissipation of up to about 100 watts. This approach permits the substitution of MCM 10 in otherwise conventionally designed systems, thereby reducing the time and costs involved in the design and production of new circuits.

The good thermal conductivity and TCE match with silicon chips is extremely beneficial for certain of the chip to substrate interface techniques, such as flip chip bonding. The high thermal conductivity of the solder bumps between silicon chips 50 and substrate 14 for flip chip bonded chips results in a very low thermal resistance between the heat producing chips and heat sink 48, especially when there are greater than about 250 solder bumps interconnecting the chip and the substrate. It is expected that an AlN MCM 10, or even a single chip module, using AlN substrate 14 should be easily capable of lowering chip junction temperatures to as low as about 85° C.

The ruggedness of AlN substrate 14 also provides a wider scope of design options. Substrate 14 may conveniently be a multilayer substrate combining thick film printed paths and components as well as fine line thin film components.

While this invention has been described with reference to its presently preferred embodiment(s), its scope is not limited thereto. Rather, such scope is only limited insofar as defined by the following set of claims and all equivalents thereof.

What is claimed is:

1. A multi-chip module, comprising:
   a heat sink;
   an aluminum nitride substrate thermally connected on a first surface to the heat sink;
   a plurality of silicon chips mounted on a second surface of the substrate;
   an alignment ring having a first portion contacting and supporting the heat sink above a printed circuit board and a second portion contacting and supporting the substrate above the circuit board; and
   elastomeric connector means supported by the alignment ring for providing electrical connection between the substrate and the printed circuit board.

2. The multi-chip module claimed in claim 1, wherein the substrate is formed of a sintered aluminum nitride fired ceramic.

3. The multi-chip module claimed in claim 2, wherein the substrate is a multilayer substrate.

4. The multi-chip module claimed in claim 1, wherein the alignment ring further comprises:

slot means maintaining the elastomeric means in a fixed position.

5. The multi-chip module claimed in claim 1, further comprising:

supporting ring means mounted on the side of the printed circuit board opposite the alignment ring for fastening the heat sink to the printed circuit board.

* * * * *